(12) United States Patent
Letor et al.

(10) Patent No.: US 12,085,601 B2
(45) Date of Patent: Sep. 10, 2024

(54) SYSTEMS AND METHODS TO MONITOR LEAKAGE CURRENT

(71) Applicant: STMicroelectronics S.r.l., Agrate Brianza (IT)

(72) Inventors: Romeo Letor, Mascalucia (IT); Veronica Puntorieri, San Giovanni la Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 198 days.

(21) Appl. No.: 17/568,278

(22) Filed: Jan. 4, 2022

(65) Prior Publication Data

US 2023/0213574 A1     Jul. 6, 2023

(51) Int. Cl.
*G01R 31/26*     (2020.01)
*G01R 19/165*    (2006.01)
*G01R 19/32*     (2006.01)
*G01R 31/28*     (2006.01)

(52) U.S. Cl.
CPC ...  *G01R 31/2642* (2013.01); *G01R 19/16528* (2013.01); *G01R 19/32* (2013.01); *G01R 31/2831* (2013.01); *G01R 31/2884* (2013.01); *G01R 31/2886* (2013.01); *H01L 2924/00* (2013.01); *H01L 2924/0002* (2013.01); *H01L 2924/14* (2013.01)

(58) Field of Classification Search
CPC .......... G01R 31/2642; G01R 19/16528; G01R 19/32; G01R 31/52; G01R 31/2621; G01R 19/2509; G01R 31/2884; G01R 31/2886; G01R 31/2831; H01L 2924/00; H01L 2924/0002; H01L 2924/14
USPC ....................................... 324/762.03
See application file for complete search history.

(56) References Cited

U.S. PATENT DOCUMENTS

| | | |
|---|---|---|
| 4,717,807 A | 1/1988 | Parks et al. |
| 6,348,806 B1 | 2/2002 | Okandan et al. |
| 2010/0164551 A1* | 7/2010 | Pigott ............... G11C 27/02 327/94 |
| 2012/0074922 A1* | 3/2012 | Suzuki ............... H02M 3/155 323/312 |
| 2018/0062510 A1* | 3/2018 | Trescases ............ H03K 17/687 |
| 2019/0245434 A1* | 8/2019 | Yang .................. G01R 19/10 |
| 2019/0346501 A1* | 11/2019 | Pronin ................ G01R 31/14 |
| 2020/0400738 A1* | 12/2020 | Akin ................. G01R 31/2621 |
| 2021/0203309 A1 | 7/2021 | Wang et al. |

* cited by examiner

*Primary Examiner* — Raul J Rios Russo
(74) *Attorney, Agent, or Firm* — Slater Matsil, LLP

(57) ABSTRACT

A system to monitor a MOSFET, the system including a switching arrangement configured to switchably isolate a gate terminal of the MOSFET and a source terminal of the MOSFET from a gate-control voltage source and a test circuit configured to detect a change in a gate-to-source voltage of the MOSFET over a test period, the test period occurring while the gate terminal and the source terminal are isolated.

20 Claims, 13 Drawing Sheets

SYSTEMS AND METHODS TO MONITOR LEAKAGE CURRENT

TECHNICAL FIELD

The present invention relates generally to a system and method to monitor the health of a MOSFET.

BACKGROUND

Generally, a MOSFET may be used to open and close a pathway for current. However, that functionality may degrade over time. For safety-critical applications such degradation may cause catastrophic results. Monitoring the gate leakage of a MOSFET may help diagnose potential issues so preventative measures may be taken before a failure occurs.

SUMMARY

In accordance with an embodiment of the present invention, a system to monitor a MOSFET includes a switching arrangement configured to switchably isolate a gate terminal of the MOSFET and a source terminal of the MOSFET from a gate-control voltage source; and a test circuit configured to detect a change in a gate-to-source voltage of the MOSFET over a test period, the test period occurring while the gate terminal and the source terminal are isolated.

In accordance with an embodiment, the system may further include a gate-terminal switch to switchably isolate the gate terminal from the gate-control voltage source and a source-terminal switch to switchably isolate the source terminal the gate-control voltage source.

In accordance with an embodiment, the system further includes wherein the test circuit comprises a voltage-sensing circuit configured to detect the gate-to-source voltage of the MOSFET.

In accordance with an embodiment, the system further includes, wherein the testing circuit comprises a sample and hold circuit coupled with an output of the voltage-sensing circuit to store a sample voltage equal to the gate-to-source voltage at a sample time.

In accordance with an embodiment, the system further includes, wherein the testing circuit further comprises a voltage subtractor circuit coupled with the output of the voltage-sensing circuit and an output of the sample and hold circuit, the voltage subtractor circuit being configured to output a difference between the sample voltage and the gate-to-source voltage.

In accordance with an embodiment, the system further includes a test sample and hold circuit configured to store the output of the voltage subtractor circuit at a test time, the difference at the test time being equal to the change in the gate-to-source voltage of the MOSFET over the test period.

In accordance with an embodiment, the system further includes a timing circuit in communication with the switching arrangement, the sample and hold circuit, and the test sample and hold circuit to trigger operation of the switching arrangement, the sample and hold circuit and test circuit.

In accordance with an embodiment, a method to monitor a MOSFET includes floating a gate of the MOSFET; detecting a change in a gate-to-source voltage of the MOSFET; determining a leakage current from the change in the gate-to-source voltage of the MOSFET; and triggering a warning when the leakage current exceeds a maximum threshold.

In accordance with an embodiment, the method further includes wherein floating the gate of the MOSFET comprises isolating the gate of the MOSFET from a gate driver.

In accordance with an embodiment, the method further includes, wherein detecting the change in the gate-to-source voltage of the MOSFET comprises sensing a sample voltage of the gate-to-source voltage before floating the gate of the MOSFET and sensing a test voltage after floating the gate of the MOSFET, the change in the gate-to-source voltage of the MOSFET being equal to a difference between the sample voltage and the test voltage.

In accordance with an embodiment, the method further includes, wherein the MOSFET is in an ON state.

In accordance with an embodiment, the method further includes, wherein the leakage current comprises leakage from the gate of the MOSFET to a source of the MOSFET and leakage from the gate of the MOSFET to a drain of the MOSFET.

In accordance with an embodiment, the method further includes, wherein the MOSFET is an OFF state.

In accordance with an embodiment, the method further includes, wherein the leakage current comprises leakage from a drain of the MOSFET to a source of the MOSFET.

In accordance with an embodiment, a test circuit for monitoring leakage current of a MOSFET includes a voltage-sensing circuit configured to detect a gate-to-source voltage of the MOSFET; a sample and hold circuit coupled with an output of the voltage-sensing circuit and configured to store a sample value of the gate-to-source voltage of the MOSFET on direction from a sample control signal; a voltage subtractor circuit coupled with the output of the voltage-sensing circuit and an output of the sample and hold circuit, the voltage subtractor circuit being configured to output a difference between the sample value and the gate-to-source voltage; and a test sample and hold circuit configured to store the output of the voltage subtractor circuit on direction of a test control signal.

In accordance with an embodiment, the test circuit further includes, wherein the voltage-sensing circuit comprises a voltmeter.

In accordance with an embodiment, the test circuit further includes a first comparator configured to receive a first reference voltage and receive the output of the voltage subtractor stored by the test sample and hold circuit, the first comparator being configured to assert an alert signal in response to the output of the voltage subtractor stored by the test sample and hold circuit exceeding the first reference voltage.

In accordance with an embodiment, the test circuit further includes a second comparator configured to receive a second reference voltage and receive the output of the voltage subtractor stored by the test sample and hold circuit, the second comparator being configured to assert an alert signal in response to the output of the voltage subtractor stored by the test sample and hold circuit exceeding the second reference voltage.

In accordance with an embodiment, the test circuit further includes, wherein the first reference voltage is correlated to a maximum leakage current for an ON state of the MOSFET and the second reference voltage is correlated to a maximum leakage current for an OFF state of the MOSFET.

In accordance with an embodiment, the test circuit further includes, a first temperature-compensation circuit in communication with a temperature sensor that detects a temperature of the MOSFET, the first temperature-compensation circuit being configured to adapt the first reference voltage depending on the temperature of the MOSFET.

In accordance with an embodiment, the test circuit further includes a second temperature-compensation circuit in communication with the temperature sensor, the second temperature-compensation circuit being configured to adapt the second reference voltage depending on the temperature of the MOSFET.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

MOSFETs and Power MOSFETS are used in many safety critical environments. For example, a Power MOSFET may be used in electronic fuses. Electronic fuses may be used in many various applications including automotive (among others). Due to their critical functionality, electronic fuses may be subject to exacting safety standards. For example, when incorporated into automotive power systems, an electronic fuse may need to be specified with high Automotive Safety Integrity Level according to ISO26262 (the international standard for functional safety of electrical and/or electronic systems that are installed in road vehicles). Detecting and managing potential failures of a MOSFET is important for ensuring safety and functionality. In the context of a fuse, a MOSFET may be used to open a current pathway. If the MOSFET loses the ability to control the current, it can no longer serve it critical function. A failure in a short circuit may strongly compromise safety requirements because there might be no way to shut off a device that has gone out of control.

Two main physical degradations in the gate structure of a MOSFET may lead to critical failures that compromise the ability of a MOSET to control the current pathway: leakage in the gate oxide and charge trapping in the gate oxide. Monitoring gate leakage variations make it possible to detect device degradation early and prevent potential failures. It may be advantageous to perform such monitoring during operations of a device.

Figure 1:
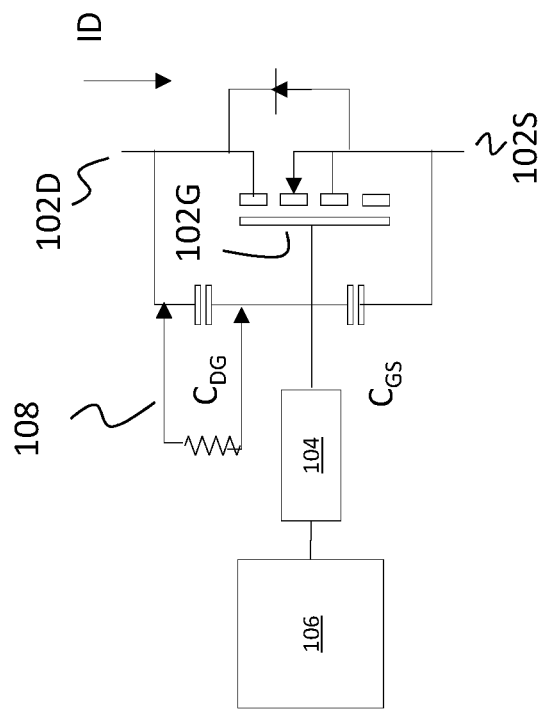
FIG. 1 illustrate leakage current of a MOSFET.

FIG. 1 illustrate leakage current of a MOSFET.

A system 100 may comprise a MOSFET 102 comprising a gate terminal 102G, a drain terminal 102D and a source terminal 102S. The MOSFET 102 may be coupled with a gate driver 104 and a controller 106. A drain to gate capacitance of the MOSFET 102 is represented by $C_{DG}$ and a gate to source capacitance is represented by $C_{GS}$. Current ID may flow between the drain and source depending on the voltage present at the gate of the MOSFET 102. As will be appreciated, during normal operation, the path for the current ID may be opened and closed by controlling the voltage provided to the gate. In general terms for an N-type MOSFET, the path may conduct electricity if the gate-to-source voltage ($V_{GS}$) of the MOSFET is greater than a threshold voltage ($V_{th}$) of the MOSFET. In the case of a fuse, the path for current ID may be opened in the event of a short circuit to prevent damage or other failures. The gate driver 104 may supply gate voltage to the MOSFET 102 on direction of the controller 106

However, leakage may compromise the ability of the MOSFET 102 to perform as expected. Leakage current may be represented by the path 108 in FIG. 1 The leakage can reduce the gate threshold required to put the MOSFET in a conductive state. For example, when drain to source voltage ($V_{DS}$) of the MOSFET 102 exceeds the threshold voltage, this voltage may be applied to the gate of the MOSFET 102. This may put the MOSFET in an ON state, and the controller 106 may lose the ability to turn put the MOSFET into an OFF state. When such control is relied on for operation of a fuse, the fuse can no longer perform its critical function. And the MOSFET may remain ON. The MOSFET, thus, will lose the ability to interrupt the circuit when required. And, this can lead to high temperature, damage, and present a fire hazard.

These risks may be reduced through monitoring the gate leakage current of a MOSFET during operation. However, this presents challenges because leakage current may be very small. The range of measurements may fall in nA or even pA. Leakage may be a function of temperature. And, there is a need for in-field measurements.

Figure 2:
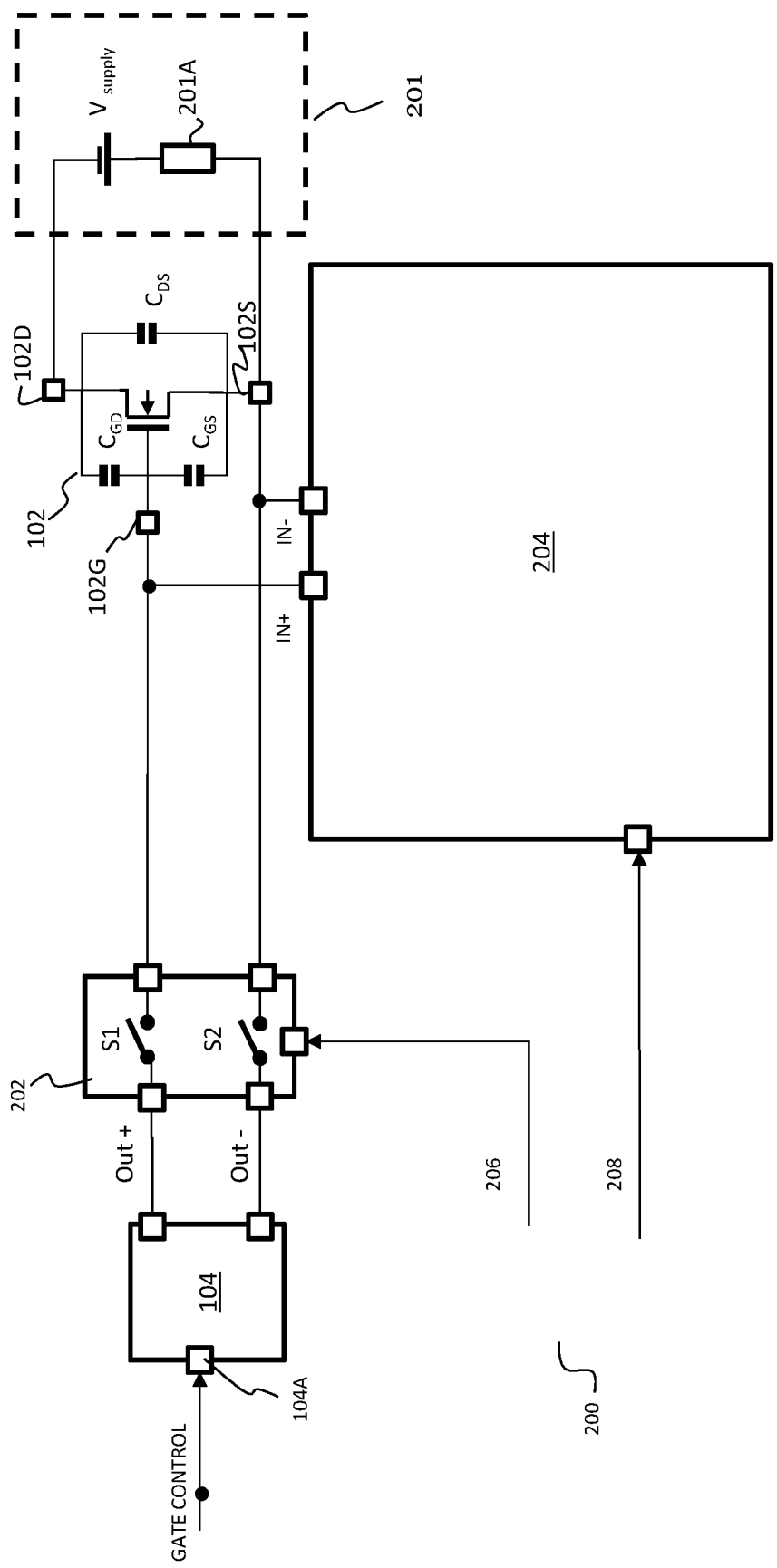
FIG. 2 depicts a system to monitor a MOSFET consistent with an embodiment.

FIG. 2 depicts a system to monitor a MOSFET consistent with an embodiment.

Unless otherwise indicated in this disclosure, the same numeric identifier may be used to identify the same elements in different figures. To avoid redundancy, and in the interest of brevity, these elements will not be described again for each figure. In various embodiments, a system 200 to monitor a MOSFET 102 may comprise a switching arrangement 202 and a test circuit 204. The MOSFET 102 may comprise a gate terminal 102G, a source terminal 102S and a drain terminal 102D. The parasitic capacitance of the MOSFET may be modeled by $C_{GD}$ (Gate Drain), $C_{GS}$ (Gate Source), and $C_{DS}$ (Drain Source). The MOSFET 102 may be coupled with circuitry 201 such as a power supply $V_{supply}$ and load 201A.

A gate driver 104 may receive gate control signals and provide output voltages to drive the MOSFET 102. In various embodiments, the gate driver 104 may be coupled with the gate terminal 102G and the source terminal 102S. The gate driver 104 may receive control signals from a controller 106 (not depicted in FIG. 2).

In various embodiments, the switching arrangement 202 may be configured to switchably isolate the gate terminal 102G of the MOSFET 102 and the source terminal 102S of the MOSFET from a gate-control voltage source (such as the gate driver 104). The switching arrangement 202 may receive a control signal 206 that may trigger the switching arrangement 202 to couple or de-couple the gate terminal 102G and the source terminal 102S.

In various embodiments, the switching arrangement 202 may comprise a gate-terminal switch S1 to switchably isolate the gate terminal 102G from the gate-control voltage source. The switching arrangement 202 may comprise a source-terminal switch S2 that switchably isolates the source terminal 102S. For example, asserting the control signal 206 may open the gate-terminal switch S1 and the source-terminal switch S2 thereby isolating the gate terminal 102G and the source terminal 102S from the gate driver 104. As will be appreciated, the switching arrangement 202 may be implemented in a variety of ways. In various embodiments, the switching arrangement 202 may be implemented with a single switch. In various embodiments, separate control signals may be utilized for a gate-terminal switch S1 may open and source-terminal switch S2.

When the gate terminal 102G and the source terminal 102S of the MOSFET 102 are isolated, the gate of the MOSFET 102 may be considered to be floating. This may be advantageous to allow measurement of a change in the gate-to-source voltage ($V_{GS}$) of the MOSFET 102, which in turn can be used to determine leakage.

The test circuit 204 may be configured to detect a change in $V_{GS}$ of the MOSFET 102. The test circuit 204 may determine the change in $V_{GS}$ over a test period. The duration of the test period may be different in different embodiments. In various embodiments, the duration of the test period may be programmable or variable. In various embodiments, the test circuit 204 may comprise a positive terminal IN+ and a negative terminal IN−. The positive terminal IN+ may be coupled with the gate terminal 102G and the negative terminal IN− may be coupled with the source terminal 102S to allow detection of the $V_{GS}$. The test circuit 204 may also receive one or more control signals 208. The control signals may determine when to initiate a test and it may also be used to end a test. As will be appreciated the test circuit 204 may implemented in various ways in various embodiments.

Figure 3:
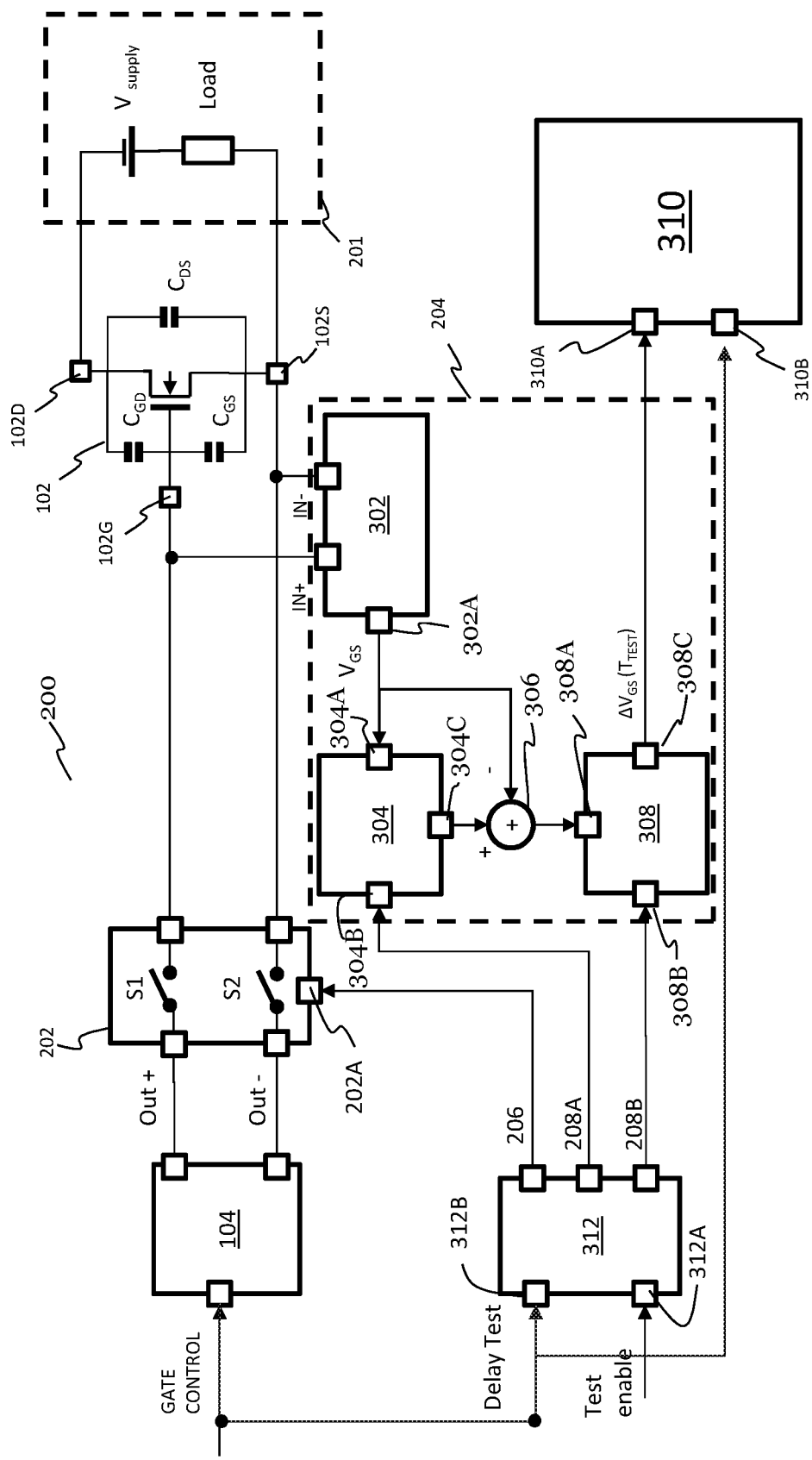
FIG. 3 depicts a system to monitor a MOSFET and a test circuit consistent with an embodiment.

FIG. 3 depicts a system to monitor a MOSFET and a test circuit consistent with an embodiment.

In various embodiments of the system 200, the test circuit 204 may comprise a voltage-sensing circuit 302. The voltage-sensing circuit 302 may be configured to detect the gate-to-source voltage of the MOSFET 0102. For example, the voltage-sensing circuit 302 may comprise a voltmeter. The voltage-sensing circuit 302 may be coupled with the gate terminal 102G at a positive terminal IN+ and coupled to with the source terminal at a negative terminal IN−. The voltage-sensing circuit 302 may provide the gate-to-source voltage $V_{GS}$ of the MOSFET 102 at an output 302A.

In various embodiments, the voltage-sensing circuit 302 may comprise a memory 304 to store a sample value of $V_{GS}$. For example, Vs may be sampled at the beginning of a leakage test to be compared with a later value of $V_{GS}$ detected at a later time. The difference between the sample $V_{GS}$ value and test $V_{GS}$ value may referred to as the change in the $V_{GS}$ ($\Delta V_{GS}$)

In various embodiments, the memory 304 may comprise a sample and hold circuit. The memory 304 may receive a control signal 208A to determine when to store the sample $V_{GS}$. The memory 304 may comprise an input terminal 304A to receive $V_{GS}$ from the voltage-sensing circuit 302.

The memory 304 may also comprise an input terminal 304B to receive the control signal 208A. The sample $V_{GS}$ may be provided to an output 304C.

After storing the sample $V_{GS}$ it may be used as a frame of reference for calculating the change in $V_{GS}$ during a test period. For example, Vs may be sampled again and the difference may be used as the change in $V_{GS}$ ($\Delta V_{GS}$). As will be appreciated, various embodiments may implement different approaches for determining $\Delta V_{GS}$. This may be accomplished digitally or with analog circuitry.

In various embodiments, the test circuit 204 may comprise a voltage subtractor 306 coupled with the output 302A of the voltage-sensing circuit and an output 304C of the memory 304. The voltage subtractor 306 circuit being configured to output a difference between the sample $V_{GS}$ and the current level of the gate-source voltage.

The test circuit 204 may also comprise another sample and hold circuit, a test sample and hold circuit 308 to store the output of the voltage subtractor 306 at a test time. The test sample and hold circuit 308 may comprise an input 308A to receive the output of the voltage subtractor 306. The test sample and hold circuit 308 may also comprise an input 308B to receive control signal 208B. The control signal 208B may determine when to store the output of the voltage subtractor 306. The value stored at this time may comprise $\Delta V_{GS(test)}$. The difference at the test time may be equal to the change in the gate-source voltage of the MOSFET 102 over the test period. This value may be provided to output 308C. A timing circuit 312 may coordinate operation of the switching arrangement 202, the storage of the sample VGS in the memory 304, and the storage of the $\Delta V_{GS(test)}$ in the test sample and hold circuit 308. In various embodiments, the timing circuit 312 may supply the control signal 206, the control signal 208A, and control signal 208B.

Once $\Delta V_{GS}$(TEST) has been determined it may be provided to other circuitry for additional processing. $\Delta V_{GS}$ (TEST) may be used to calculate a leakage current $I_{Leakage}$. As will be appreciated, the calculation may differ depending on whether the gate control is ON or OFF. An equation to calculate the leakage current when the gate control is ON is provided by Equation 1.

$$I_{Leakage}(GS + GD) = \frac{\Delta V_{GS}(\text{TEST}) * (C_{GS} + C_{GD})}{T_{Open\ Gate}} \quad \text{Equation 1}$$

In Equation 1, $I_{Leakage}$ represents the total the gate to source leakage (GS) and gate to drain leakage (GD). $\Delta V_{GS}$ (TEST) is the difference between the sample $V_{GS}$ and the test $V_{GS}$. And, $C_{GS}+C_{GD}$ is the sum of the gate to source capacitance and the gate to drain capacitance. $T_{Open\ Gate}$ is the time that that gate terminal 102G and the source terminal 102S have been isolated by the switching arrangement 202.

An equation to calculate the leakage current when the gate control is ON is provided by Equation 2.

$$I_{Leakage}(DG) = \frac{\Delta V_{GS}(\text{TEST}) * (C_{GS})}{T_{Open\ Gate}} \quad \text{Equation 2}$$

In Equation, $I_{Leakage}$ represents drain to source leakage.

In various embodiments, the system 200 may further comprise a processing circuit 310. The processing circuit may receive $\Delta V_{GS}$(TEST) at an input 310A. The processing circuit 310 may also receive the gate control signal at an input 310B. The processing circuit 310 may comprise a non-transitory computer readable medium storing instructions to calculate the leakage current according to Equation 1 or Equation 2 depending on whether the MOSFET is in an ON state or OFF state (as determined by the gate control signal). In various embodiments, measured values from measured values may stored to identify trends in changes in leakage current. The processing circuit 310 may be implemented with circuitry embedded in the device or by an external independent processor.

Figure 4:
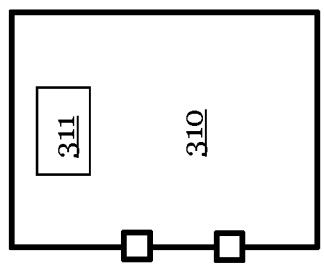
FIG. 4 depicts an embodiment of the processing circuit in accordance with an embodiment.

FIG. 4 depicts an embodiment of the processing circuit in accordance with an embodiment.

In various embodiments, the processing circuit 310 may comprise a non-transitory computer readable memory 311 to store an instruction set that caused the processing circuit 310 to determine the leakage current according to Equation 1 and Equation 2 depending on whether the MOSFET is ON or OFF As referenced, the system 200 may be used to monitor leakage of the MOSFET 102 in either in an ON state or an OFF state.

Figure 5:
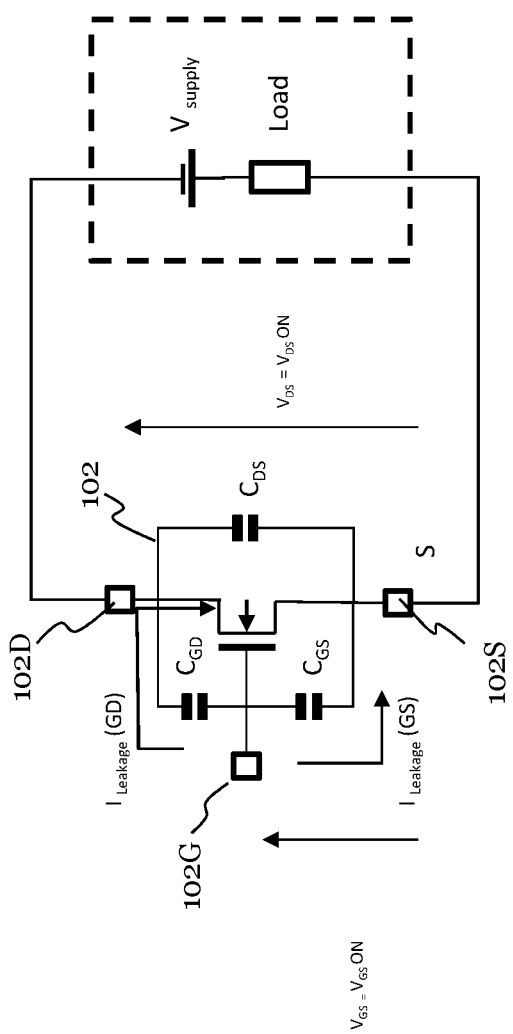
FIG. 5 illustrates leakage of a MOSFET in an ON state

FIG. 5 illustrates leakage of a MOSFET in an ON state.

To maintain an ON state of the MOSFET, the gate driver 104 may polarize the gate of MOSFET 102 with a voltage required for MOSFET saturation (with switching arrangement 202 in a closed state), so that the MOSFET can have a $V_{DS}$ ON low enough ($\approx 0$) to activate the Load. The leakage in the gate oxide of the MOSFET may be measured by monitoring the gate voltage variation $\Delta V_{GS}(T_{TEST})$ while the gate is left floating by opening the switching arrangement 202 for a certain time. When the gate is floating, there is no current flow outside the MOSFET structure, therefore a change of the gate voltage may be associated to a current flowing internally to the MOSFET that is discharging the capacitance of gate oxide itself. Current leakage may occur from the gate to the drain of the MOSFET ($I_{Leakage}$ GD) and from the gate to the source of the MOSFET ($I_{Leakage}$ GDS). Since the MOSFET is ON and $V_{DS}$ON$\approx$0, the current flown can be originated in the gate to source oxide or in the gate to drain oxide or both.

This internal leakage current may discharge the gate oxide capacitance and Equation 1 may be used to calculate the leakage as a function of $\Delta V_{GS}(T_{TEST})$. This test may be performed during operation of the MOSFET. The leakage test will not interfere with Load activation because in normal operating conditions the gate voltage will remain constant and the MOSFET $V_{DS}$ON will not change. In various embodiments, the timing of leakage test may be selected to limit the gate voltage variation to a low value that is compatible with MOSFET full conduction. For example, the period of the test where the switching arrangement 202 keeps the gate in a floating state may be selected to comprise a duration that will not impact operation of the MOSFET. Additionally, it is possible to overdrive the gate with a slightly higher voltage to compensate eventual gate voltage variations due to a leakage test. It is also possible to utilize a leakage test to account to non-constant leakage current because the gate will discharge according to the charge Q=∫i(t) dt.

Figure 6:
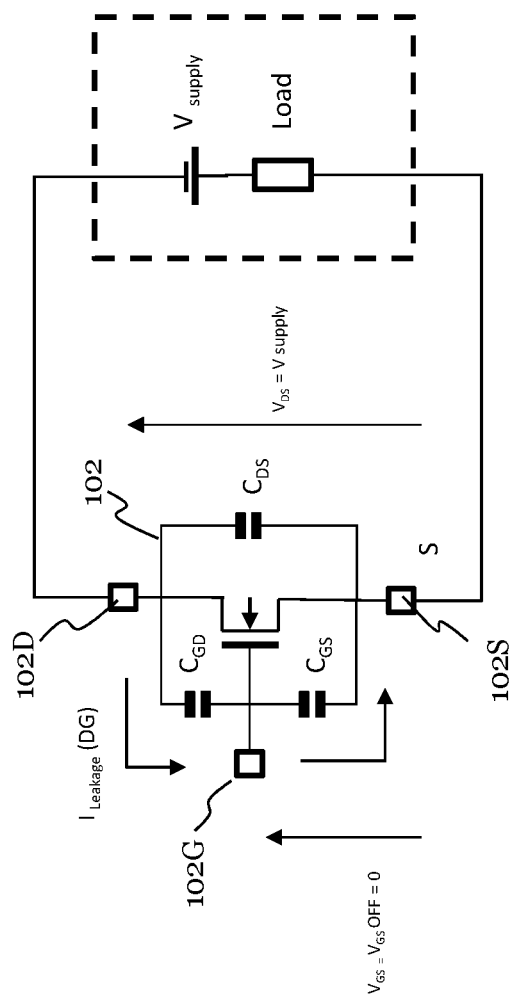
FIG. 6 illustrates leakage of a MOSFET in an OFF state.

FIG. 6 illustrates leakage of a MOSFET in an OFF state.

To maintain an OFF state of the MOSFET, the gate driver 104 may polarize the gate (with switching arrangement 202 in a closed state) of the MOSFET with a voltage=0 required for MOSFET OFF state, so that the MOSFET cannot activate the Load and $V_{DS}$=V supply. In this state, the leakage in the gate oxide may be measured by measuring the gate voltage variation $\Delta V_{GS}(T_{TEST})$ while the gate is left floating by opening switching arrangement 202 for a test period time.

When the gate is floating, there may be no current flowing in the gate source pins from outside the MOSFET, therefore variation of the gate voltage may be associated with a current flowing internally to the MOSFET. Potential current from the drain to the gate can charge the capacitance of gate source oxide. Since the Power MOSFET is OFF, the drain is polarized so that $V_{DS}$=$V_{supply}$ and the current may be originated in the drain to gate oxide. It should be noted that no current will leak from the gate to the source because they are at the same voltage.

This internal leakage current may charge the gate source oxide capacitance and Equation 2 may be used to calculate the leakage as a function of $\Delta V_{GS}(T_{TEST})$. The test operation may be performed without impacting load activation because, in normal operating conditions, the gate voltage will remain constant (equal to zero) and the MOSFET state will not change. It is also possible to select the timing of the leakage test (the time period that the gate is left floating) in order to limit the gate voltage variation to a low value compatible with a MOSFET OFF state ($V_{GS}$<VTH). As referenced while discussing the ON state, in the case of a non-constant leakage current, this approach may still be used because the gate capacitance will charge according to the charge Q=∫i(t) dt. While in the OFF state, it may be verified that leakage is due the leakage in the oxide Drain to Source of MOSFET. This may be useful if leakage is detected in an ON state. Another test may be performed while the MOSFET is an OFF state to determine whether the leakage is generated in the oxide gate source or in the oxide gate drain.

Figure 7:
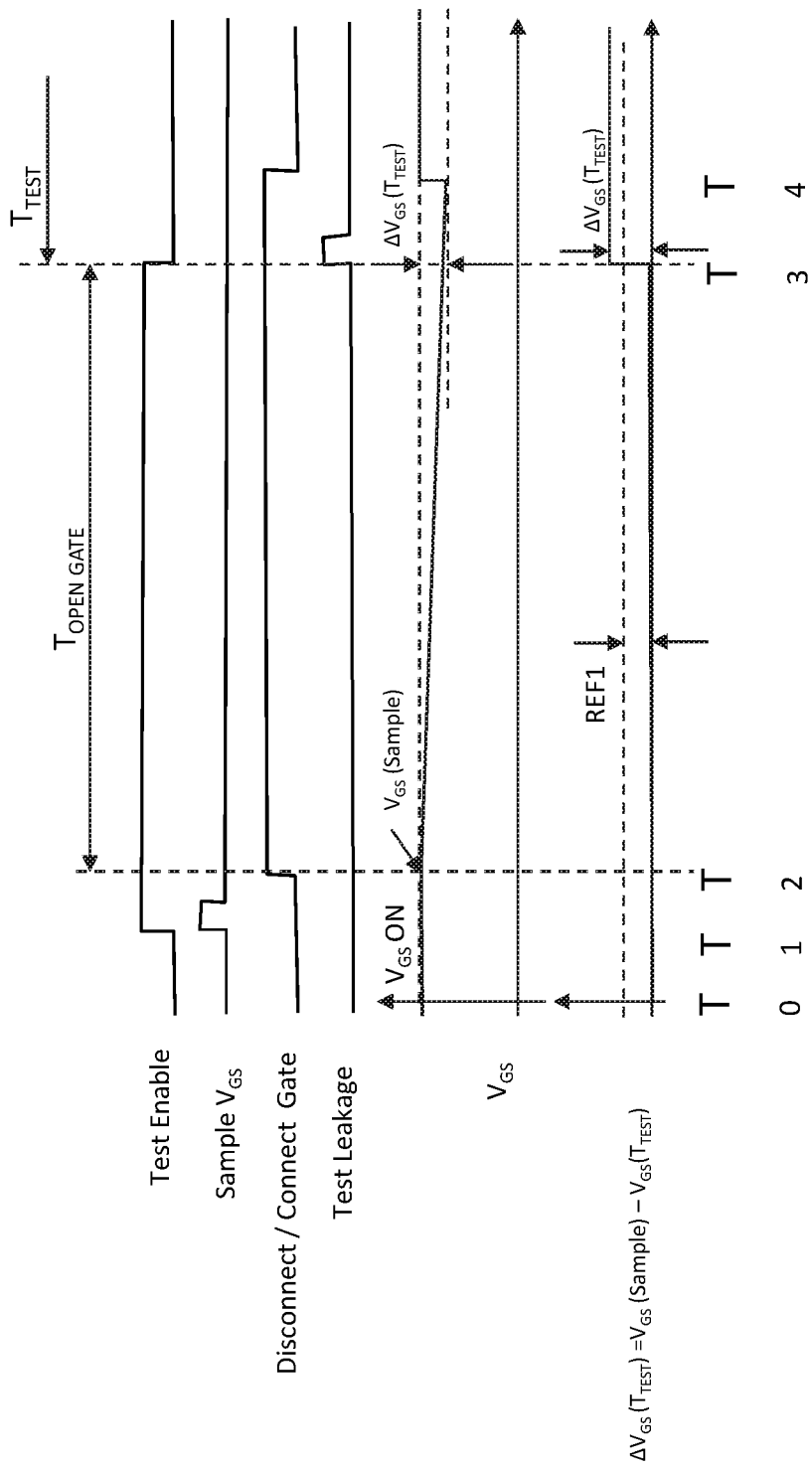
FIG. 7 depicts a timing diagram for a system to monitor leakage current of a MOSFET in an ON state in accordance with an embodiment.

FIG. 7 depicts a timing diagram for a system to monitor leakage current of a MOSFET in an ON state in accordance with an embodiment.

In various embodiments, timing signals may be utilized to trigger operations of a system 200. Example waveforms for testing signals for monitoring leakage during an ON state of a MOSFET may include a Test-Enable signal. The Test-Enable signal may initiate a leakage test. In various embodiments, the Test-Enable signal may be received by a timing circuit 312 at a test-enable input 312A (as depicted in FIG. 3). Additional timing signals may also include a Sample Vas signal, which may cause the gate-to-source voltage of the MOSFET 102 to be sampled (and stored). In various embodiments, Sample $V_{GS}$ may be carried on a control signal 208A from timing circuit 312 and provided to input terminal 304B of memory 304 to cause the memory to store the value of the gate source voltage at that time as the sample gate source voltage.

A Disconnect/Connect Gate signal may operate the switching arrangement 202. For example, the switching arrangement 202 may isolate the gate terminal 102G and the source terminal 102S when the Disconnect/Connect Gate signal is asserted. When de-asserted, the switching arrangement 202 may undo the isolation of the gate terminal 102G and source terminal 102S.

Additional timing signals may include a Test Leakage signal. The Test Leakage signal, when asserted, may cause the system 200 to store the value of $\Delta V_{GS}$. In other words, the time between the opening of the switching arrangement 202 (the assertion of the Disconnect/Connect Gate signal) and the time when the Test Leakage signal is asserted may be the $T_{OPEN\ GATE}$. In various embodiments the Disconnect/Connect Gate signal may be carried by control signal 206 to input 202A. The Test Leakage signal may be received by sample and hold circuit 308 at input 308B and carried on control signal 208B.

By way of an example, at a time, $T_0$, the gate may be polarized with respect to the source to an ON voltage $V_{GSON}$. At a time $T_1$, the Test Enable signal may be asserted. This may cause the Sample Vas signal to be asserted, which may cause the memory 304 to store $V_{GS}$ at that time as $V_{GS}$ (Sample). At time $T_2$, the Disconnect/Connect Gate may be asserted causing the Gate to become floating. In various embodiments, there may be a delay between $T_1$ and $T_2$ to allow $V_{GS}$ (Sample) to be stored and to account for any internal delays. $V_{GS}$ may begin to decrease due to any current leakage. After a duration of desired length, the Test Leakage signal may be asserted at $T_3$. The difference between $V_{GS}$ and $V_{GS}$ (Sample) at time $T_3$ may be stored as $\Delta V_{GS}$ (TEST), which can then be used to determine the leakage current. At time $T_4$, the Disconnect/Connect Gate signal may be de-asserted and the gate may be coupled again with a gate driver 104. Vas may be restored to Vas ON. The time period between $T_2$ and $T_3$ may be considered the time period the change in leakage current is measured and used as $T_{OPEN\ GATE}$.

Figure 8:
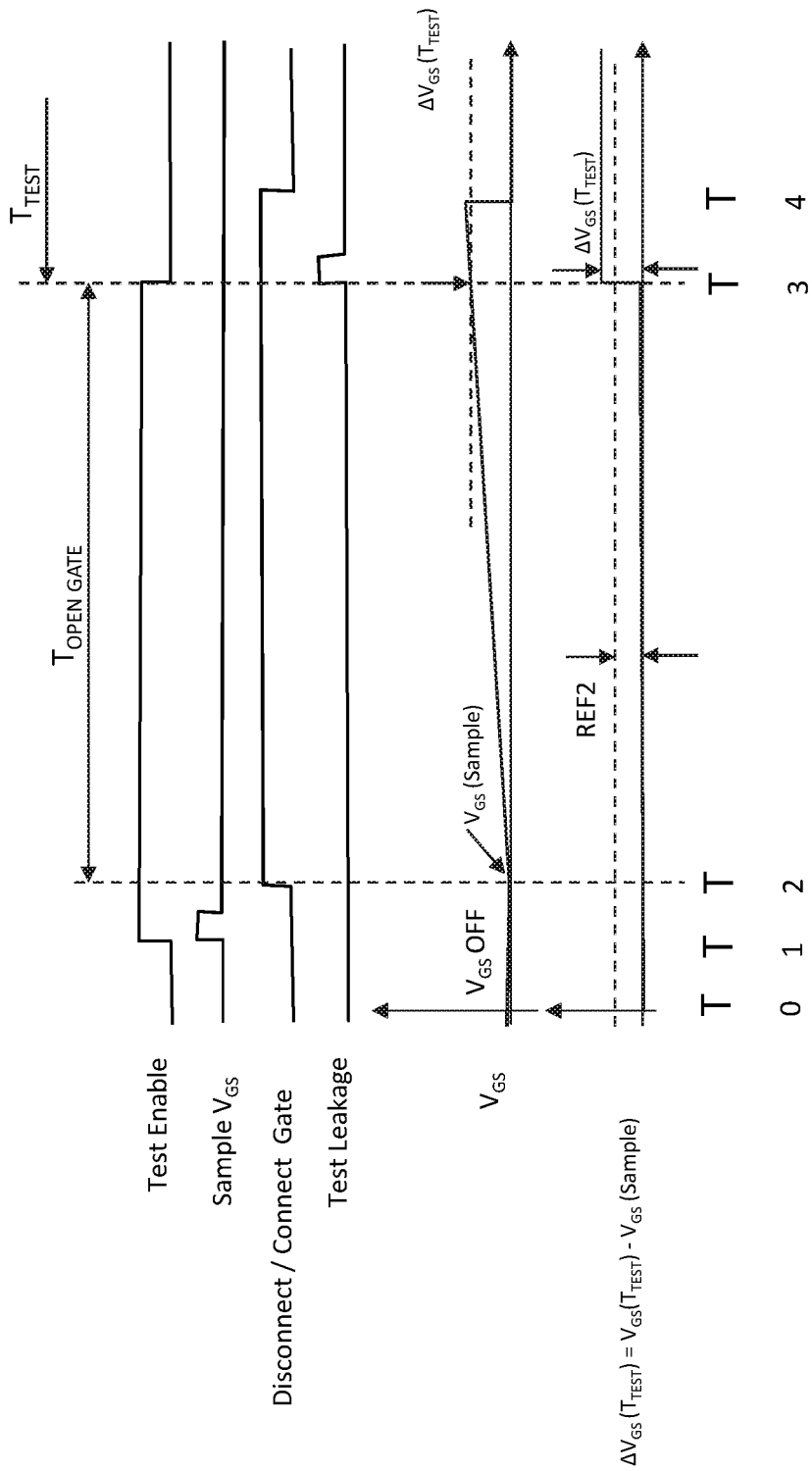
FIG. 8 depicts a timing diagram for a system to monitor leakage current of a MOSFET in an OFF state in accordance with an embodiment.

FIG. 8 depicts a timing diagram for a system to monitor leakage current of a MOSFET in an OFF state in accordance with an embodiment.

The Test Enable, Sample $V_{GS}$, Disconnect/Connect Gate Signal, may operate in the same way whether when the MOSFET is both ON and OFF. At To, the $V_{GS}$ may be maintained at $V_{GS}$ OFF. At a time $T_1$, the Test Enable Signal may be asserted. In response, the Sample $V_{GS}$ Signal may also be asserted. This may cause the memory to store $V_{GS}$ (Sample). When the MOSFET is in an OFF state, the $V_{GS}$ may be equal to zero. After $V_{GS}$ (Sample) has been stored, the Disconnect/Connect Gate signal may be asserted at time $T_2$. In various embodiments, there may be a delay between $T_1$ and $T_2$ to allow Vas (Sample) to be stored and to account for any internal delays. After the Disconnect/Connect Gate signal is asserted the Gate may become floating due to operation of the switching arrangement 202. As discussed with reference to FIG. 6, the capacitance of gate source oxide may be charged by leakage when the MOSFET is in an OFF state. So, the value of $V_{GS}$ may increase while the gate is floating. After a desired time period has passed, the Test Leakage Signal may be asserted at time $T_3$, and $\Delta V_{GS}$(Test) may be stored. At time $T_4$, the Disconnect/Connect Gate may be de-asserted and the Gate and Source may be coupled to gate driver 104. $V_{GS}$ may return to zero. The time period between $T_2$ and $T_3$ may be considered the time period the change in leakage current is measured and used as $T_{OPEN\ GATE}$.

In various embodiments, a delay may be utilized so that value of the $V_{GS}$ is stable when a Vas (Sample) is stored. This may be advantageous because it may take time to bring up or down the voltage level to Vas ON or Vas OFF after assertion of a gate control signal. As will be appreciated, a gate driver 104 may receive a gate control signal that determines output voltage provided by the gate driver 104. The gate driver 104 may receive a gate control signal at an input 104A (See FIG. 2). The gate control signal bay change depending on the desired state of the MOSFET 102 (ON or OFF). And, the gate driver 104 may respond by providing a corresponding voltage output. However, there may be a lag between assertion of the gate control signal and completion of the transition of the state of the MOSFET. It may be beneficial to introduce a delay period after a change of the gate control so $V_{GS}$ is stable when sampled.

Figure 9:
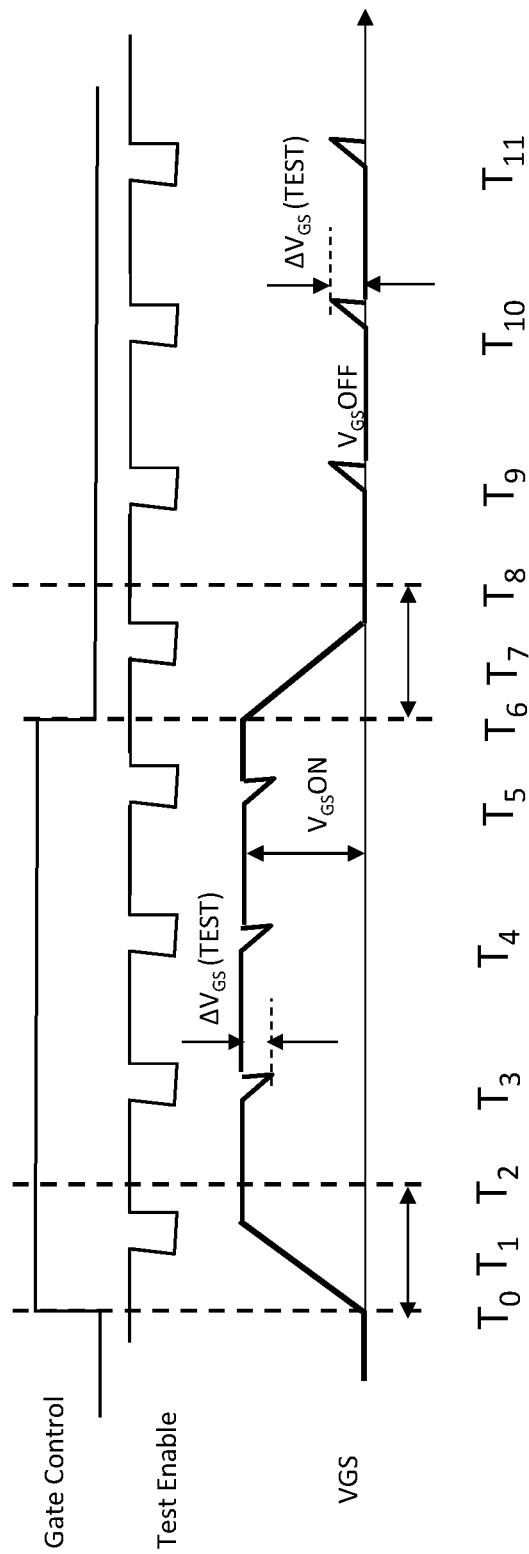
FIG. 9 depicts a timing waveform with a delay in accordance with an embodiment.

FIG. 9 depicts a timing waveform with a delay in accordance with an embodiment. A Gate Control signal may be asserted at a time $T_0$. In response, the VGS may begin to transition from a $V_{GS}$ OFF state to a $V_{GS}$ ON state. $V_{GS}$ may reach a stable ON value at $T_2$. However, at a time $T_1$, a Test Enable signal may be asserted. However, a leakage test may be stopped because the Test Enable signal asserted at time $T_1$ occurred during the delay between $T_0$ and $T_2$. At time $T_3$, the Test Enable signal may be asserted again thereby triggering a leakage test for a MOSFET in an ON state. VGS may fall as a function of any leakage current. Additional leakage tests may be initiated by the Test Enable signal while the MOSFET is in the ON state at times $T_4$ and $T_5$. At a time $T_6$, the Gate Control state may switch thereby transitioning the MOSFET from an ON state to an OFF state. VGS may stabilize at VGS OFF at time $T_8$. Meanwhile, at time $T_7$, the Test Enable signal may be asserted. But, a leakage test may be prevented because the $T_2$ falls between $T_6$ and $T_8$. After the delay period is over, an OFF state leakage test may be initiated at times $T_9$, $T_{10}$ and $T_{11}$. While performing an OFF state leakage test, Vas may increase while the gate is floating as discussed with reference to FIG. 6.

In various embodiments, the Gate Control provided to gate driver 104 may also be provided to a timing circuit 312 to communicate when a transition from an ON state to an OFF state has been initiated. The timing circuit may receive the Gate Control signal at an input 312B (As depicted in FIG. 3). The timing circuit 312 may then delay initiation of a leakage test until a delay period has lapsed. The delay period may vary in various embodiments depending on time needed to stabilize the MOSFET at either $V_{GS}$ ON or $V_{GS}$ OFF. In various embodiments, a leakage test may be initiated as soon as the delay period expires after a Test Enable signal has been asserted. In various embodiments, the Gate Control Signal may also be provided to processing circuit 310 at input 310B, to communicate the state of the MOSFET (ON or OFF).

Figure 10:
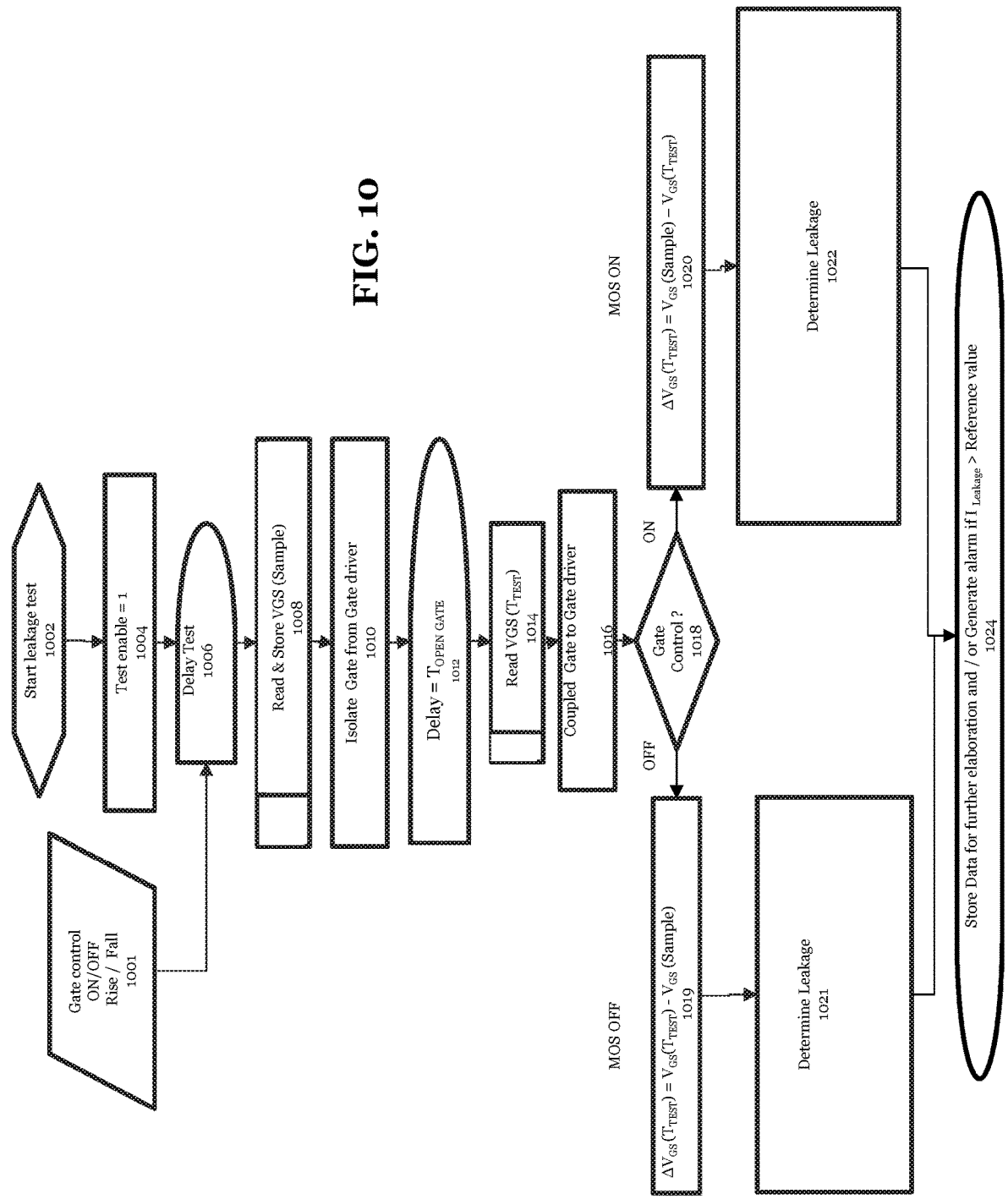
FIG. 10 depicts a flow chart of a method to monitor the leakage current of a MOSFET in accordance with an embodiment.

FIG. 10 depicts a flow chart of a method to monitor the leakage current of a MOSFET in accordance with an embodiment.

In various embodiments, a method to monitor the leakage current of a MOSFET may comprise at a step 1002 starting a leakage test. At a step 1004, a Test Enable Signal may be asserted. In various embodiments, this may comprise setting the Test Enable Signal to a "1." As a step 1006, it may be determined whether a delay is needed. This may depend on how recently the MOSFET has begun a transition from one state (OFF or ON) to another state. If not in a delay period, the method 1000 may comprise at a step 1008 reading $V_{GS}$ and storing the value of $V_{GS}$ as the sample $V_{GS}$. At a step 1010, the gate of the MOSFET may be isolated from a gate driver. At a step 1012, the method may comprise waiting for a period equal to $T_{OPEN\ GATE}$. After passage of $T_{OPEN\ GATE}$, $V_{GS}$ may be read again. At a step 1016, the gate may be re-coupled to the gate driver. At a step 1018, it may be determined what state the MOSFET is in. This may be determined, in various embodiments, from the Gate Control Signal.

If the MOSFET is in an OFF state, the method 1000 may proceed to step 1019. At a step 1019, $\Delta V_{GS(Test)}$ may be determined. And, at a step 1021, leakage for a MOSFET in an OFF state may be determined using $\Delta V_{GS(Test)}$.

If the MOSFET is in an ON state, the method 1000 may proceed to step 1020. At a step 1020, $\Delta V_{GS(Test)}$ may be determined. And, at a step 1022, leakage for a MOSFET in an ON state may be determined using $\Delta V_{GS(Test)}$.

At a step 1024, the leakage current may be stored. In various embodiments, the leakage current may be compared with a reference and an alarm asserted if the leakage is greater than a reference voltage. In various embodiments, additional action may be taken depending on the leakage current. In some embodiments, a current may be determined from $\Delta V_{GS(Test)}$ before a comparison is made.

In various embodiments, the $\Delta V_{GS(Test)}$ may compared to a reference voltage to determine whether to assert a warning.

Figure 11:
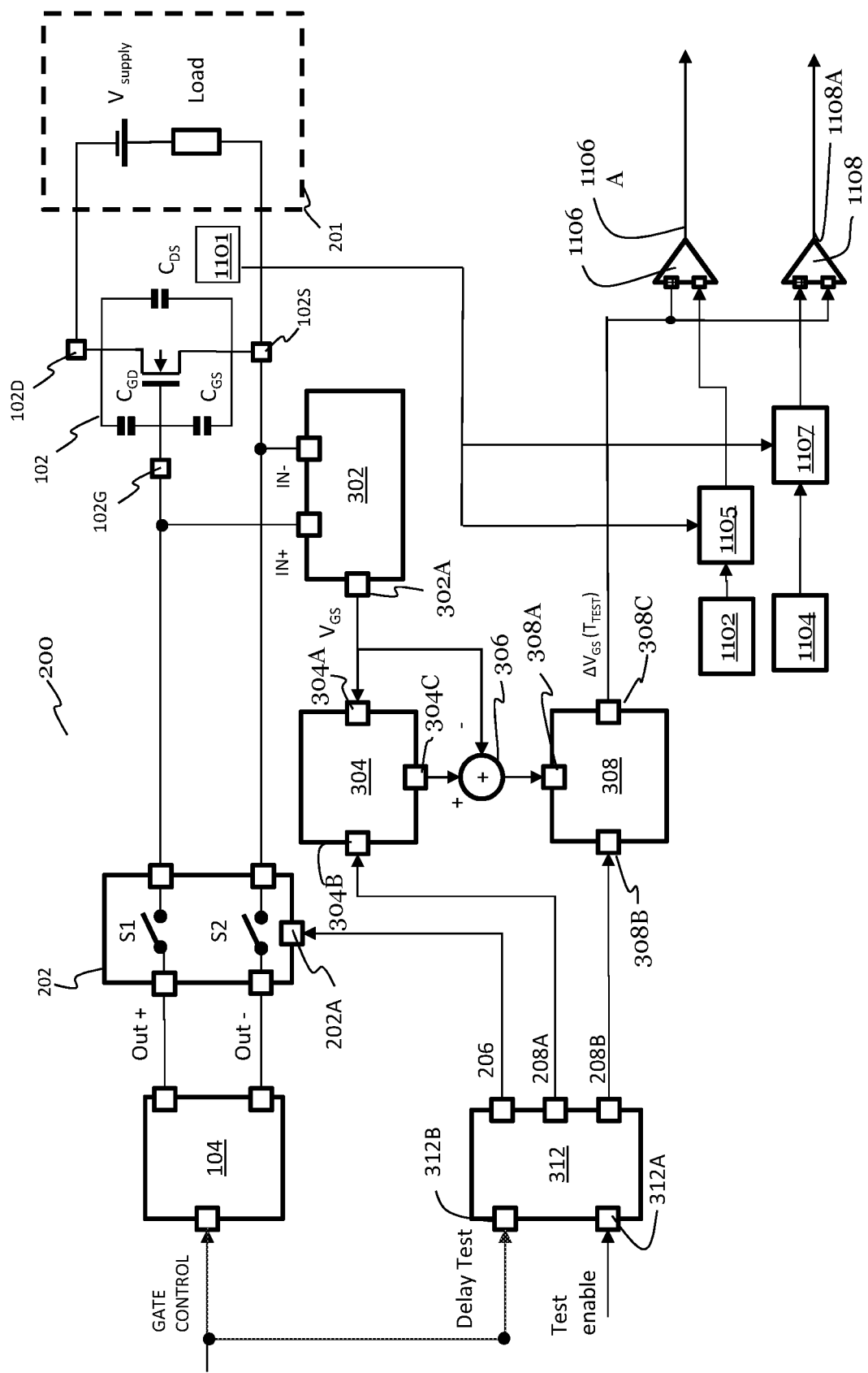
FIG. 11 depicts a system to monitor leakage of a MOSFET in accordance with an embodiment.

FIG. 11 depicts a system to monitor leakage of a MOSFET in accordance with an embodiment.

The system 200 may comprise a first reference-voltage generator 1102 and a second reference-voltage generator 1104. The first reference-voltage generator 1102 may produce a reference voltage associated with the maximum gate source and gate drain leakage. This reference voltage may be utilized to compare with $\Delta V_{GS(Test)}$ while the MOSFET is in an ON state. The output of the first reference-voltage generator 1102 may be coupled with a first comparator 1106. In various embodiments, the system may further comprise a temperature compensation circuit 1105 and a temperature sensor 1101. The temperature sensor 1101 may detect the temperature at or in the vicinity of the MOSFET 102. And, depending on the temperature detected, the temperature compensation circuit 1105, which may be in communication with the first reference-voltage generator 1102 and temperature sensor 1101, may output a compensated reference voltage. The first comparator 1106 may receive the compensated reference voltage and $\Delta V_{GS(Test)}$. The first comparator 1106 may produce a signal that indicates when $\Delta V_{GS(Test)}$ exceeds the compensated reference voltage. For example, output 1106A of the first comparator may go high when $\Delta V_{GS(Test)}$ is greater than the compensated reference voltage.

The second reference-voltage generator 1104 may generate a reference voltage associated with the maximum variation of $\Delta V_{GS(Test)}$ associated with drain to gate leakage. This reference voltage may be utilized in conjunction with leakage tests performed during an OFF state of the MOSFET. The referenced voltage provided by the second reference-voltage generator 1104 may be provided to a temperature compensation circuit 1107. The temperature compensation circuit 1107 may adjust the reference voltage depending on the temperature sensed by the temperature sensor 1101 and output a compensated reference voltage to a comparator 1108. The comparator 1108 may also receive $\Delta V_{GS(Test)}$ and provide a signal at an output 1108A that indicates when the $\Delta V_{GS(Test)}$ exceeds the compensated reference voltage. The output 1106A and output 1108A (when asserted) may trigger warnings or other operations in response to determining that the current has exceeded a desired level.

In various embodiments, temperature compensation may be accomplished using a look up table that is addressed by the thermal sensor output. The addressed value of the look up table may define a multiplication factor and normalize the measured value to a defined temperature (25C by example) via a digital multiplier. An A/D converter may be used to transform analogue measured values to digital values for temperature compensation, which may also be applied for leakage measurement.

Figure 12:
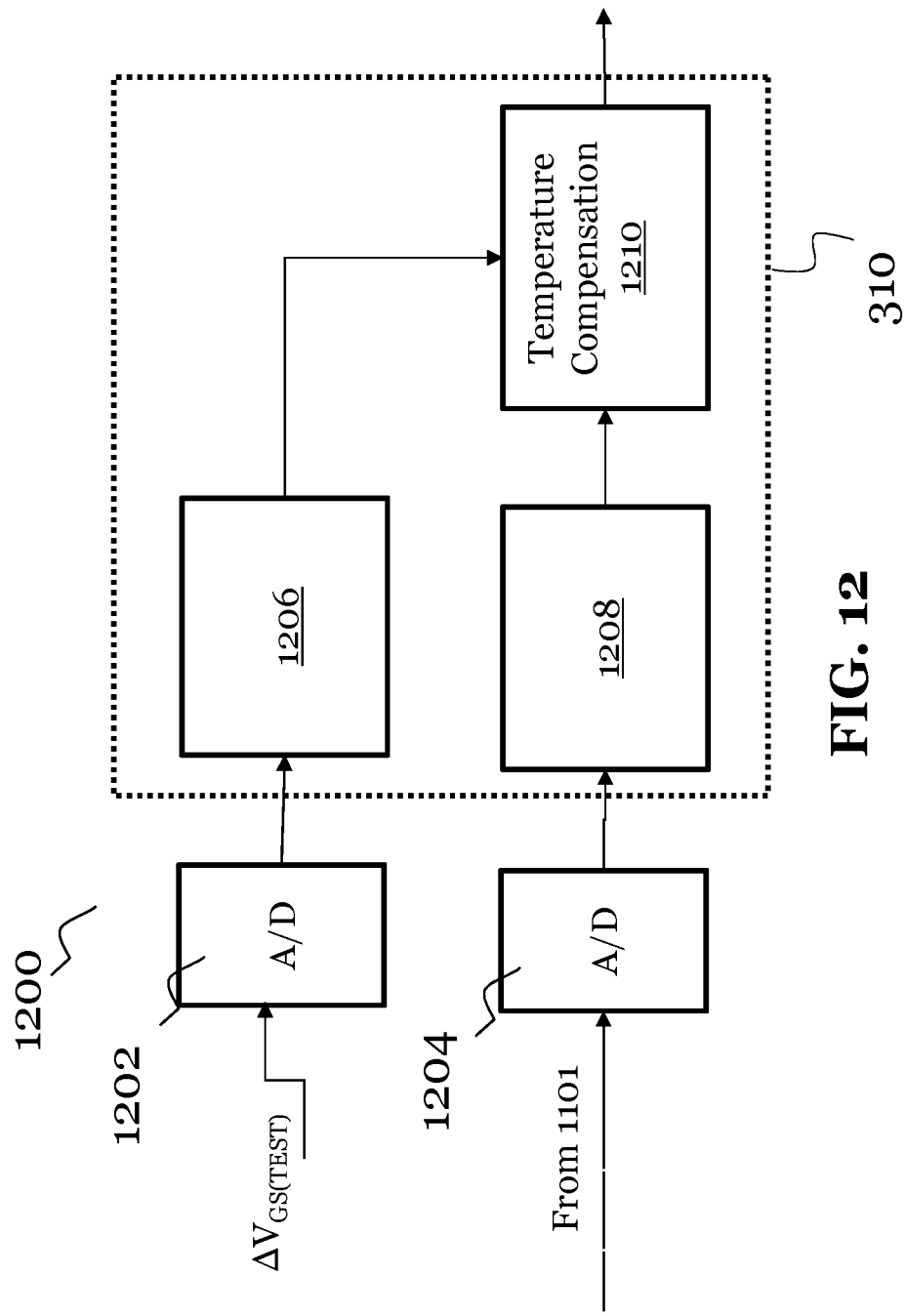
FIG. 12 depicts a system for determining temperature compensation.

FIG. 12 depicts a system for determining temperature compensation.

The system 1200 may comprise a first A/D converter 1202 and a second A/D converter 1204. The first A/D converter may receive $\Delta V_{GS(TEST)}$ and the second A/D converter may receive data from temperature sensor 1101. The first A/D converter 1202 and a second A/D converter 1204 may convert their respective inputs into digital data. Digital data from the first A/D converter may be used to determine leakage current by a processing circuit 310 with a leakage calculator 1206. A temperature calculator 1208, of the processing circuit 310 may use the output from the second A/D 1204 converter to determine a temperature from the sensor data provided by temperature sensor 1101. Temperature compensation may then be performed at 1210 given the leakage current and the temperature by using a lookup table or other process.

As will be appreciated, the reference voltage produced by the first reference-voltage generator 1102 and the second reference-voltage generator 1104 may be different in different embodiments. Equation 3 provides an example to determine a value for a reference voltage associated with maximum leakage from the gate to source and gate to drain.

$$\text{Reference} = \frac{\text{Max } I_{Leakage} * T_{OPEN\ GATE}}{C_{GS} + C_{GD}} \qquad \text{Equation 3}$$

In Equation 3, Max $I_{Leakage}$ is the desired maximum leakage for the gate to source and gate to drain, which may be associated with a leakage test performed while a MOSFET is an ON state.

Equation 4 provides an example to determine a value for a reference voltage associated with maximum leakage from drain to gate.

$$\text{Reference} = \frac{\text{Max } I_{Leakage} * T_{OPEN\ GATE}}{C_{GS}} \qquad \text{Equation 4}$$

In Equation 3, Max $I_{Leakage}$ is the desired maximum leakage for the drain to gate, which may be associated with a leakage test performed while a MOSFET is an OFF state.

Measurement of $V_{GS}$ may occur while the MOSFET is an ON state or OFF state.

Figure 13:
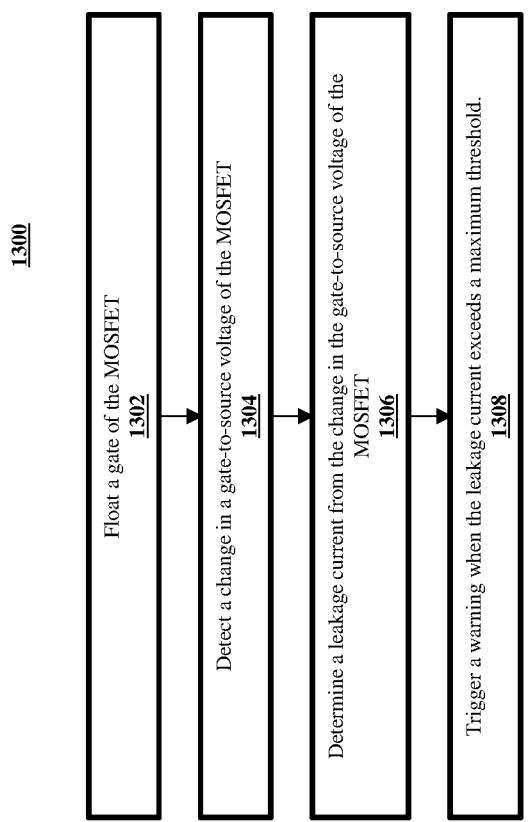
FIG. 13 depicts a flow chart illustrating steps of a method in accordance with an embodiment.

FIG. 13 depicts a flow chart illustrating steps of a method in accordance with an embodiment.

In various embodiments, a method 1300 to monitor a MOSFET ma include at a step 1302, floating a gate of the MOSFET; at a step 1304, detecting a change in a gate-to-source voltage of the MOSFET; at a step 1306, determining a leakage current from the change in the gate-to-source voltage of the MOSFET; and at a step 1308 triggering a warning when the leakage current exceeds a maximum threshold.

In various embodiments, the method 1300 may further comprise wherein floating the gate of the MOSFET comprises isolating the gate of the MOSFET from a gate driver.

In various embodiments, the method 1300 may further comprise, wherein detecting the change in the gate-to-source voltage of the MOSFET comprises sensing a sample voltage of the gate-to-source voltage before floating the gate of the MOSFET and sensing a test voltage after floating the gate of the MOSFET, the change in the gate-to-source voltage of the MOSFET being equal to a difference between the sample voltage and the test voltage.

In various embodiments, the method 1300 may further comprise, wherein the MOSFET is in an ON state.

In various embodiments, the method 1300 may further comprise, wherein the leakage current comprises leakage from the gate of the MOSFET to a source of the MOSFET and leakage from the gate of the MOSFET to a drain of the MOSFET.

In various embodiments, the method 1300 may further comprise, wherein the MOSFET is an OFF state.

In various embodiments, the method 1300 may further comprise, wherein the leakage current comprises leakage from a drain of the MOSFET to a source of the MOSFET.

It should be appreciated that this disclosure is not limited a specific flavor or MOSFET and leakage current could be tested for a P-type MOSFET, which would have the opposite polarity.

Example 1. A system to monitor a MOSFET, the system including a switching arrangement configured to switchably isolate a gate terminal of the MOSFET and a source terminal of the MOSFET from a gate-control voltage source; and a test circuit configured to detect a change in a gate-to-source voltage of the MOSFET over a test period, the test period occurring while the gate terminal and the source terminal are isolated.

Example 2. The systems of Example 1, wherein the switching arrangement includes a gate-terminal switch to switchably isolate the gate terminal from the gate-control voltage source and a source-terminal switch to switchably isolate the source terminal the gate-control voltage source.

Example 3. The systems of Example 1 and Example 2, wherein the test circuit comprises a voltage-sensing circuit configured to detect the gate-to-source voltage of the MOSFET.

Example 4. The systems of Example 1 through Example 3, wherein the testing circuit comprises a sample and hold circuit coupled with an output of the voltage-sensing circuit to store a sample voltage equal to the gate-to-source voltage at a sample time.

Example 5. The systems of Example 1 through Example 4, wherein the testing circuit further comprises a voltage subtractor circuit coupled with the output of the voltage-sensing circuit and an output of the sample and hold circuit, the voltage subtractor circuit being configured to output a difference between the sample voltage and the gate-to-source voltage.

Example 6. The systems of Example 1 through Example 5, further comprising a test sample and hold circuit configured to store the output of the voltage subtractor circuit at a test time, the difference at the test time being equal to the change in the gate-to-source voltage of the MOSFET over the test period.

Example 7. The systems of Example 1 through Example 6, further comprising a timing circuit in communication with the switching arrangement, the sample and hold circuit, and the test sample and hold circuit to trigger operation of the switching arrangement, the sample and hold circuit and test circuit.

Example 8. A methods to monitor a MOSFET comprising: floating a gate of the MOSFET; detecting a change in a gate-to-source voltage of the MOSFET; determining a leakage current from the change in the gate-to-source voltage of the MOSFET; and triggering a warning when the leakage current exceeds a maximum threshold.

Example 9. The methods of Example 8, wherein floating the gate of the MOSFET comprises isolating the gate of the MOSFET from a gate driver.

Example 10. The methods of Example 8 and Example 9, wherein detecting the change in the gate-to-source voltage of the MOSFET comprises sensing a sample voltage of the gate-to-source voltage before floating the gate of the MOSFET and sensing a test voltage after floating the gate of the MOSFET, the change in the gate-to-source voltage of the MOSFET being equal to a difference between the sample voltage and the test voltage.

Example 11. The methods of Example 8 though Example 10, wherein the MOSFET is in an ON state.

Example 12. The methods of Example 8 though Example 11, wherein the leakage current comprises leakage from the gate of the MOSFET to a source of the MOSFET and leakage from the gate of the MOSFET to a drain of the MOSFET.

Example 13. The methods of Example 8 though Example 12, wherein the MOSFET is an OFF state.

Example 14. The methods of Example 8 though Example 13, wherein the leakage current comprises leakage from a drain of the MOSFET to a source of the MOSFET.

Example 15. A test circuit for monitoring leakage current of a MOSFET, the test circuit comprising: a voltage-sensing circuit configured to detect a gate-to-source voltage of the MOSFET; a sample and hold circuit coupled with an output of the voltage-sensing circuit and configured to store a sample value of the gate-to-source voltage of the MOSFET on direction from a sample control signal; a voltage subtractor circuit coupled with the output of the voltage-sensing circuit and an output of the sample and hold circuit, the voltage subtractor circuit being configured to output a difference between the sample value and the gate-to-source voltage; and a test sample and hold circuit configured to store the output of the voltage subtractor circuit on direction of a test control signal.

Example 16. The test circuit of Example 15, wherein the voltage-sensing circuit comprises a voltmeter.

Example 17. The test circuits of Example 15 and Example 16, further comprising a first comparator configured to receive a first reference voltage and receive the output of the voltage subtractor stored by the test sample and hold circuit, the first comparator being configured to assert an alert signal in response to the output of the voltage subtractor stored by the test sample and hold circuit exceeding the first reference voltage.

Example 18. The test circuits of Example 15 through Example 17, further comprising a second comparator configured to receive a second reference voltage and receive the output of the voltage subtractor stored by the test sample and hold circuit, the second comparator being configured to assert an alert signal in response to the output of the voltage subtractor stored by the test sample and hold circuit exceeding the second reference voltage.

Example 19. The test circuits of Example 15 through Example 18, wherein the first reference voltage is correlated to a maximum leakage current for an ON state of the MOSFET and the second reference voltage is correlated to a maximum leakage current for an OFF state of the MOSFET.

Example 20. The test circuits of Example 15 through Example 19, further comprising a first temperature-compensation circuit in communication with a temperature sensor that detects a temperature of the MOSFET, the first temperature-compensation circuit being configured to adapt the first reference voltage depending on the temperature of the MOSFET.

Example 21. The test circuits of Example 15 through Example 20, further comprising a second temperature-compensation circuit in communication with the temperature sensor, the second temperature-compensation circuit being configured to adapt the second reference voltage depending on the temperature of the MOSFET.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

It is therefore intended that the appended claims encompass any such modifications or embodiments.

What is claimed is:

1. A system to monitor a MOSFET, the system comprising:
   a switching circuit comprising
   a first switch disposed between a gate terminal of the MOSFET and a gate driver to switchably isolate the gate terminal of the MOSFET from a gate-control voltage source, and
   a second switch disposed between a source terminal of the MOSFET and the gate driver to switchably isolate the source terminal from the gate-control voltage source; and
   a test circuit configured to detect a change in a gate-to-source voltage of the MOSFET over a test period, the test period occurring while the gate terminal and the source terminal are isolated.

2. The system of claim 1, wherein the test circuit comprises a voltage-sensing circuit configured to detect the gate-to-source voltage of the MOSFET.

3. The system of claim 2, wherein the test circuit comprises a sample and hold circuit coupled with an output of the voltage-sensing circuit to store a sample voltage equal to the gate-to-source voltage at a sample time.

4. The system of claim 3, wherein the test circuit further comprises a voltage subtractor circuit coupled with the output of the voltage-sensing circuit and an output of the sample and hold circuit, the voltage subtractor circuit being configured to output a difference between the sample voltage and the gate-to-source voltage.

5. The system of claim 4, further comprising a test sample and hold circuit configured to store the output of the voltage subtractor circuit at a test time, the difference at the test time being equal to the change in the gate-to-source voltage of the MOSFET over the test period.

6. The system of claim 5, further comprising a timing circuit in communication with the switching circuit, the sample and hold circuit, and the test sample and hold circuit to trigger operation of the switching circuit, the sample and hold circuit and test circuit.

7. A method to monitor a MOSFET comprising:
   operating a switching circuit to float a gate of the MOSFET;
   detecting, at a test circuit, a change in a gate-to-source voltage of the MOSFET;
   determining a leakage current from the change in the gate-to-source voltage of the MOSFET; and
   triggering a warning signal when the leakage current exceeds a maximum threshold.

8. The method of claim 7, wherein floating the gate of the MOSFET comprises isolating the gate of the MOSFET from a gate driver.

9. The method of claim 7, wherein detecting the change in the gate-to-source voltage of the MOSFET comprises sensing a sample voltage of the gate-to-source voltage before floating the gate of the MOSFET and sensing a test voltage after floating the gate of the MOSFET, the change in the gate-to-source voltage of the MOSFET being equal to a difference between the sample voltage and the test voltage.

10. The method of claim 9, wherein the MOSFET is in an ON state.

11. The method of claim 10, wherein the leakage current comprises leakage from the gate of the MOSFET to a source of the MOSFET and leakage from the gate of the MOSFET to a drain of the MOSFET.

12. The method of claim 9, wherein the MOSFET is an OFF state.

13. The method of claim 12, wherein the leakage current comprises leakage from a drain of the MOSFET to a source of the MOSFET.

14. A test circuit for monitoring leakage current of a MOSFET, the test circuit comprising:
   a voltage-sensing circuit configured to detect a gate-to-source voltage of the MOSFET;
   a sample and hold circuit coupled with an output of the voltage-sensing circuit and configured to store a sample value of the gate-to-source voltage of the MOSFET on direction from a sample control signal;
   a voltage subtractor circuit coupled with the output of the voltage-sensing circuit and an output of the sample and hold circuit, the voltage subtractor circuit being configured to output a difference between the sample value and the gate-to-source voltage; and
   a test sample and hold circuit configured to store the output of the voltage subtractor circuit on direction of a test control signal.

15. The test circuit of claim 14, wherein the voltage-sensing circuit comprises a voltmeter.

16. The test circuit of claim 14, further comprising a first comparator configured to receive a first reference voltage and receive the output of the voltage subtractor stored by the test sample and hold circuit, the first comparator being configured to assert an alert signal in response to the output of the voltage subtractor stored by the test sample and hold circuit exceeding the first reference voltage.

17. The test circuit of claim 16, further comprising a second comparator configured to receive a second reference voltage and receive the output of the voltage subtractor stored by the test sample and hold circuit, the second comparator being configured to assert an alert signal in response to the output of the voltage subtractor stored by the test sample and hold circuit exceeding the second reference voltage.

18. The test circuit of claim 17, wherein the first reference voltage is correlated to a maximum leakage current for an ON state of the MOSFET and the second reference voltage is correlated to a maximum leakage current for an OFF state of the MOSFET.

19. The test circuit of claim 17, further comprising a first temperature-compensation circuit in communication with a temperature sensor that detects a temperature of the MOSFET, the first temperature-compensation circuit being configured to adapt the first reference voltage depending on the temperature of the MOSFET.

20. The test circuit of claim 19, further comprising a second temperature-compensation circuit in communication with the temperature sensor, the second temperature-compensation circuit being configured to adapt the second reference voltage depending on the temperature of the MOSFET.

* * * * *